United States Patent
Watanabe et al.

(10) Patent No.: US 6,958,630 B2
(45) Date of Patent: Oct. 25, 2005

(54) HIGH-FREQUENCY DETECTION METHOD AND HIGH-FREQUENCY DETECTION CIRCUIT

(75) Inventors: Shinichi Watanabe, Osaka (JP); Noboru Saeki, Osaka (JP)

(73) Assignee: Pearl Kogyo Co., Ltd., Osaka (JP)

( * ) Notice: Subject to any disclaimer, the term of this patent is extended or adjusted under 35 U.S.C. 154(b) by 0 days.

(21) Appl. No.: 10/487,431

(22) PCT Filed: Aug. 1, 2002

(86) PCT No.: PCT/JP02/07884

§ 371 (c)(1), (2), (4) Date: Feb. 23, 2004

(87) PCT Pub. No.: WO03/038453

PCT Pub. Date: May 8, 2003

(65) Prior Publication Data

US 2004/0212400 A1    Oct. 28, 2004

(30) Foreign Application Priority Data

Oct. 30, 2001  (JP) ............................. 2001-332110

(51) Int. Cl.$^7$ ........................... H03D 3/00; G06F 19/00
(52) U.S. Cl. ..................... 327/47; 700/121; 315/111.21
(58) Field of Search ......................... 327/47, 105, 113; 700/121, 117; 204/192.13; 315/111.21

(56) References Cited

U.S. PATENT DOCUMENTS

| 5,474,648 A | * | 12/1995 | Patrick et al. ................. 438/10 |
| 6,020,794 A | | 2/2000 | Wilbur |
| 6,332,961 B1 | * | 12/2001 | Johnson et al. ......... 204/192.13 |
| 6,351,683 B1 | * | 2/2002 | Johnson et al. ............. 700/121 |
| 6,791,274 B1 | * | 9/2004 | Hauer et al. ............ 315/111.21 |
| 2002/0023718 A1 | | 2/2002 | Choi et al. |

FOREIGN PATENT DOCUMENTS

| EP | 0 714 106 A1 | 5/1996 |
| JP | 63-155848 A | 6/1988 |
| JP | 7-35789 A | 2/1995 |
| JP | 8-264297 A | 10/1996 |
| JP | 10-241894 A | 9/1998 |
| JP | 10-241895 A | 9/1998 |

* cited by examiner

Primary Examiner—Dinh T. Le
(74) Attorney, Agent, or Firm—Birch, Stewart, Kolasch & Birch, LLP

(57) ABSTRACT

A high frequency detection circuit detects information about a first high frequency power in a high frequency power source device supplying the first high frequency power having a first frequency and a second high frequency power having a second frequency lower than the first frequency to a load. A third high frequency signal that is a mixed signal of a first high frequency signal having the first frequency and a second high frequency signal having the second frequency is detected by a directional coupler. The third high frequency signal is converted to a fourth high frequency signal having a third frequency between the first and second frequencies using a heterodyne system. A progressive wave power of the first frequency is detected based on the fourth high frequency signal.

6 Claims, 5 Drawing Sheets

HIGH-FREQUENCY DETECTION METHOD AND HIGH-FREQUENCY DETECTION CIRCUIT

TECHNICAL FIELD

The present invention relates to a high frequency detection method and a high frequency detection circuit, and more particularly to a high frequency detection method and a high frequency detection circuit for detecting information about a first high frequency power in a high frequency power source device supplying the first high frequency power having a first frequency and a second high frequency power having a second frequency lower than the first frequency to a load.

BACKGROUND ART

In recent years, there has been developed a plasma process technique for supplying a high frequency power at a relatively high frequency f and a high frequency power at a relatively low frequency f1 to a reaction chamber. In this plasma process technique, plasma is generated mainly with the high frequency power at frequency f, and the high frequency power at frequency f1 is used to control the behavior of ions in the vicinity of a substrate.

In such a plasma process technique, it is important to accurately measure the voltage, current, power, and the like of frequency f. When f is approximately 1000 times higher than frequency f1, however, the measurement is difficult. This is because the high frequency power at frequency f is modulated by the high frequency power at frequency f1 in the reaction chamber to cause a high frequency power at a frequency f±nf1 (where n is an integer equal to or greater than 0), and a filter circuit that extracts only the high frequency signal at frequency f from the high frequency signal at frequency f±nf1 is not available at present.

Therefore, the voltage, current, power and the like of frequency f±nf1 has conventionally been used as the voltage, current, power, and the like of frequency f. Accordingly, the level variations of the voltage, current, power, and the like of frequency f1 also causes the level variations of the voltage, current, power, and the like of frequency f, thereby leading to a low reproducibility in measurement.

DISCLOSURE OF THE INVENTION

The present invention aims to provide a high frequency detection method and a high frequency detection circuit capable of easily and accurately detecting information about a first high frequency power in a high frequency power source device supplying the first frequency power having a first frequency and a second high frequency power having a second frequency lower than the first frequency to one load.

In a high frequency detection method in accordance with the present invention, the following steps are performed: a first step of detecting a third high frequency signal that is a mixed signal of a first high frequency power having a first frequency and a second high frequency power having a second frequency at a prescribed node of a high frequency power source device; a second step of generating a reference signal having a frequency shifted toward a higher frequency side or a lower frequency side from the first frequency by a third frequency between the first and second frequencies; a third step of generating a mixed signal of the third high frequency signal detected at the first step and the reference signal generated at the second step; a fourth step of extracting a fourth high frequency signal having the third frequency from the mixed signal generated at the third step; and a fifth step of detecting information about the first high frequency power based on the fourth high frequency signal extracted at the fourth step. Therefore, the third high frequency signal that is a mixed signal of the first high frequency signal at the first frequency and the second high frequency signal at the second frequency is converted to the fourth high frequency signal at the third frequency between the first and second frequencies using a heterodyne system, and based on the fourth high frequency signal, the information about the first high frequency power is detected, so that the information about the first high frequency power can be detected easily and accurately and the high frequency power source device can be controlled accurately.

A high frequency detection circuit in accordance with the present invention is provided with: a signal detection circuit detecting a third high frequency signal that is a mixed signal of a first high frequency power having a first frequency and a second high frequency power having a second frequency at a prescribed node of a high frequency power source device; a signal generation circuit generating a reference signal having a frequency shifted toward a higher frequency side or a lower frequency side from the first frequency by a third frequency between the first and second frequencies; a mixer circuit generating a mixed signal of the third high frequency signal detected by the signal detection circuit and the reference signal generated by the signal generation circuit; a filter circuit extracting a fourth high frequency signal having the third frequency from the mixed signal generated by the mixer circuit; and an information detection circuit detecting information about the first high frequency power based on the fourth high frequency signal extracted by the filter circuit. Therefore, the third high frequency signal that is a mixed signal of the first high frequency signal at the first frequency and the second high frequency signal at the second frequency is converted to the fourth high frequency signal at the third frequency between the first and second frequencies using a heterodyne system, and based on the fourth high frequency signal, the information about the first high frequency power is detected, so that the information about the first high frequency power can be detected easily and accurately and the high frequency power source device can be controlled accurately.

Preferably, two sets of the signal detection circuits, the signal generation circuits, the mixer circuits, and the filter circuits are provided. The signal detection circuit in one set detects the third high frequency signal indicative of a high frequency voltage at the prescribed node. The signal detection circuit in the other set detects the third high frequency signal indicative of a high frequency current at the prescribed node. The information detection circuit detects the information about the first high frequency power based on the two fourth high frequency signals extracted by the two filter circuits. In this case, it is possible to detect a high frequency voltage, a high frequency current, a ratio therebetween, a phase difference therebetween, and the like.

BEST MODES FOR CARRYING OUT THE INVENTION

Figure 1:
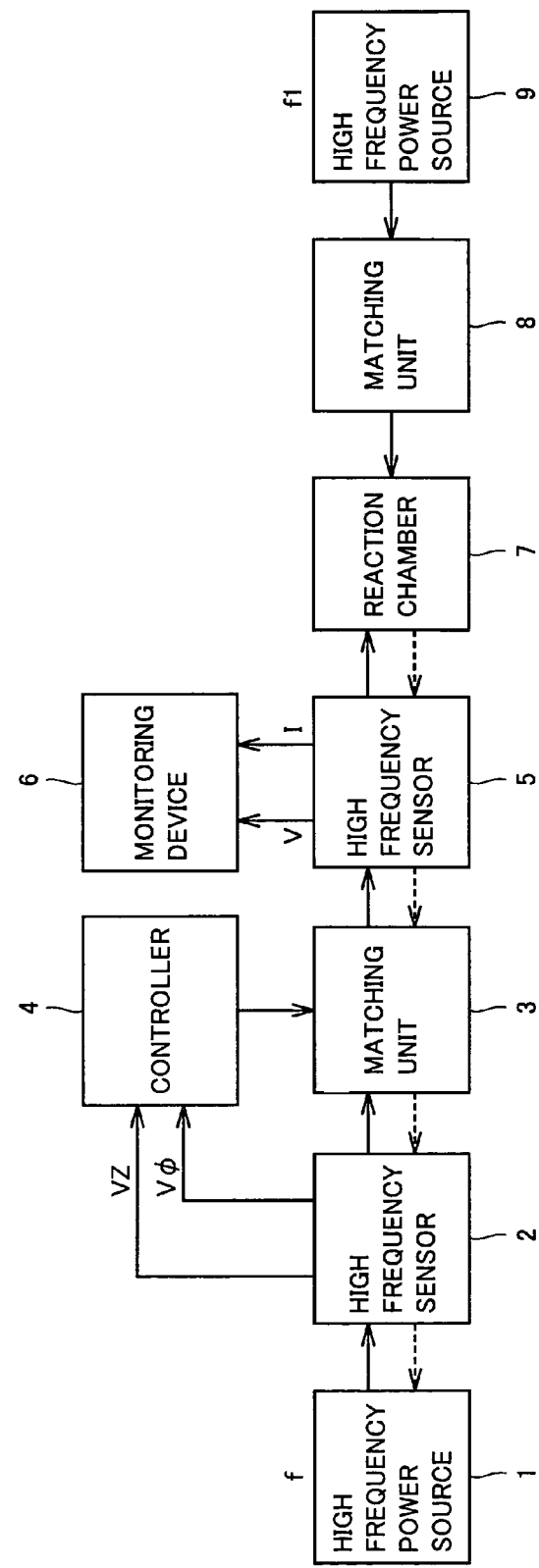
FIG. 1 is a block diagram showing a configuration of a semiconductor manufacturing apparatus in accordance with an embodiment of the present invention.

FIG. 1 is a block diagram showing a configuration of a semiconductor manufacturing apparatus in accordance with an embodiment of the present invention. In FIG. 1, the semiconductor manufacturing apparatus includes high frequency power sources 1, 9, high frequency sensors 2, 5, matching units 3, 8, a controller 4, a monitoring device 6, and a reaction chamber 7. The semiconductor manufacturing apparatus supplies a high frequency power having a relatively high frequency f (or example 500 MHz) from high frequency power source 1 and a high frequency power having a relatively low frequency f1 (for example 800 KHz) from high frequency power source 9 to reaction chamber 7 to generate plasma.

Figure 2:
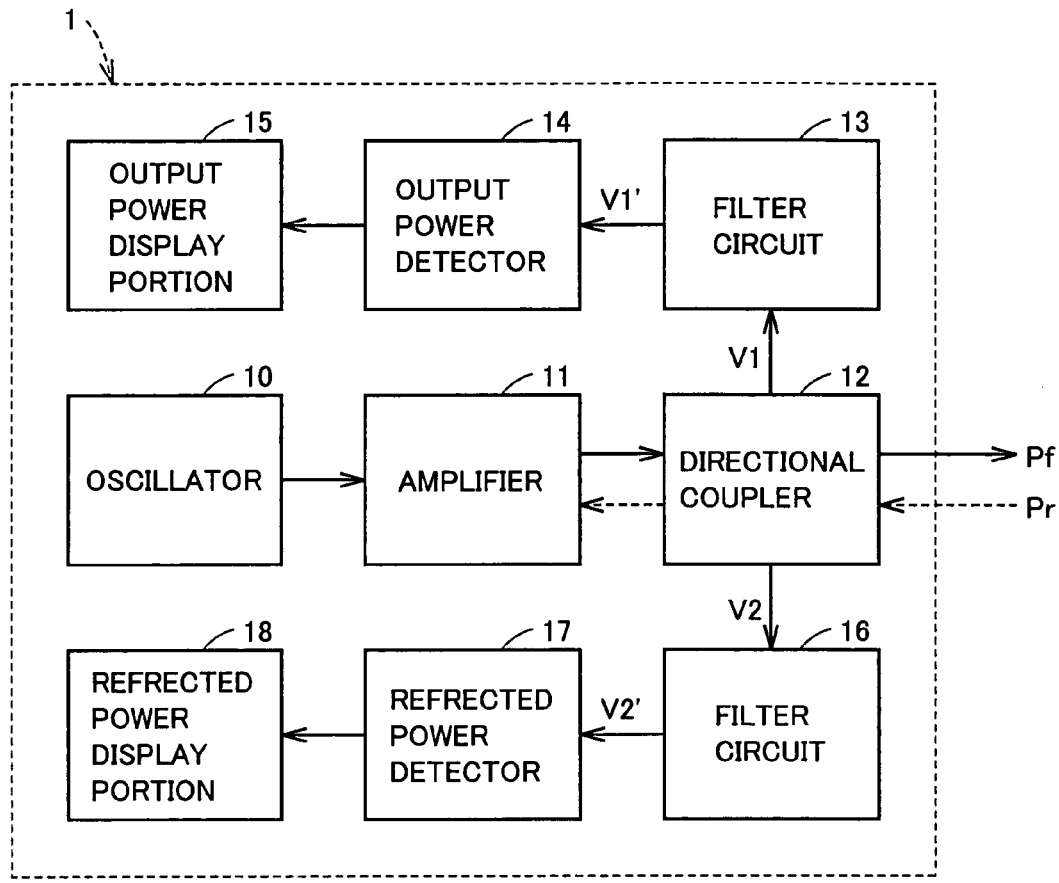
FIG. 2 is a block diagram showing a configuration of a high frequency power source 1 shown in FIG. 1.

High frequency power source 1 is a main power source device for supplying the high frequency power at frequency f to reaction chamber 7. High frequency power source 1 includes an oscillator, 10, an amplifier 11, a directional coupler 12, filter circuits 13, 16, an output power detector 14, an output power display portion 15, a reflected power detector 17, and a reflected power display portion 18, as shown in FIG. 2.

Oscillator 10 outputs a high frequency signal at frequency f. Amplifier 11 amplifies the high frequency signal generated at oscillator 10 to a signal of a desired power. The amplified high frequency signal is supplied through directional coupler 12 to matching unit 3.

Figure 3:
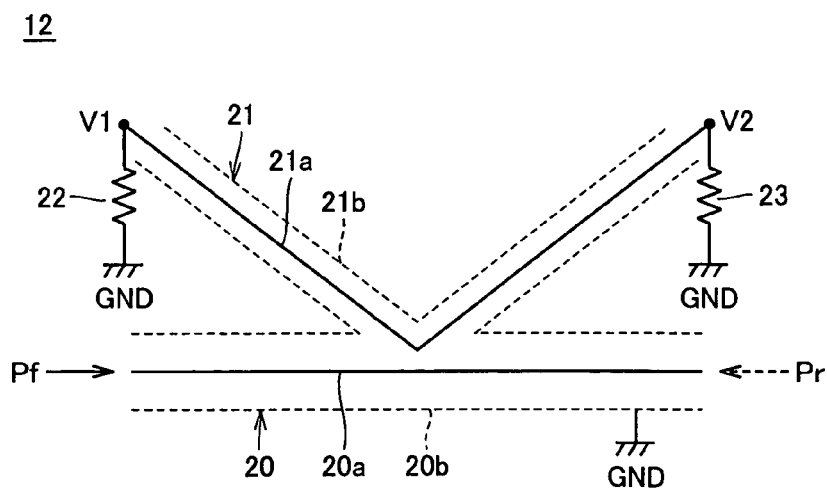
FIG. 3 is a circuit diagram showing a configuration of a directional coupler shown in FIG. 2.

Directional coupler 12 includes a primary coaxial line 20, a secondary coaxial line 21, and resistance elements 22, 23, as shown in FIG. 3. Primary coaxial line 20 includes an internal conductor 20a and an external conductor 20b and forms a part of the coaxial line between amplifier 11 and matching unit 3. Secondary coaxial line 21 includes an internal conductor 21a and an external conductor 21b. External conductors 20b, 21b are grounded together. The middle portion of secondary coaxial line 21 is loosely coupled to a part of primary coaxial line 20 in such a manner that an impedance change of primary coaxial line 20 is as small as possible. Resistance element 22 is connected between an upstream end portion of internal conductor 21a of secondary coaxial line 21 and a ground potential GND line. Resistance element 23 is connected between a downstream end portion of internal conductor 21a of secondary coaxial line 21 and a ground potential GND line. Resistance elements 22 and 23 have the same resistance value R.

A characteristic impedance $Z_0$ of primary coaxial line 20, a coupling capacitance $C_0$ between primary coaxial line 20 and secondary coaxial line 21, a mutual inductance M between primary coaxial line 20 and secondary coaxial line 21, and resistance value R of resistance elements 22, 23 have a relationship represented by $Z_0=M/C_0R$. Where the voltages across terminals of resistance elements 22, 23 are V1 and V2, respectively, and a proportionality constant is K, a progressive wave power Pf and a reflected wave power Pr are represented by $K(V1)^2$ and $K(V2)^2$, respectively. Output voltages V1, V2 of directional coupler 12 are applied to filer circuits 13, 16, respectively.

Figure 4:
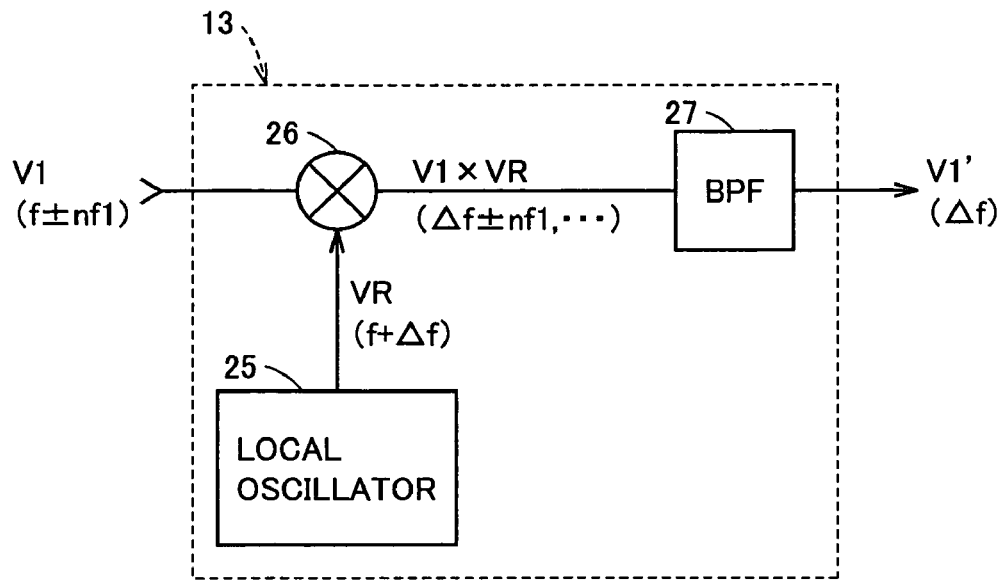
FIG. 4 is a block diagram showing a configuration of a filter circuit shown in FIG. 2.

Filter circuit 13 converts a high frequency signal V1 having a frequency f=nf1 to a high frequency signal V1' having a frequency Δf, using a heterodyne system. Frequency Δf is a frequency (for example 10.6 MHz) which is sufficiently lower than frequency f of high frequency power source 1 and higher than frequency f1 of high frequency power source 9. More specifically, filter circuit 13 includes a local oscillator 25, a mixer 26, and a bandpass filter (BPF) 27, as shown in FIG. 4. Local oscillator 25 generates a high frequency signal VR having a frequency f+Δf, which is a sum of frequency f of high frequency power source 1 and a prescribed frequency Δf, for application to mixer 26. Mixer 26 mixes output signal V1 of directional coupler 12 with output signal VR of local oscillator 25.

Figure 5:
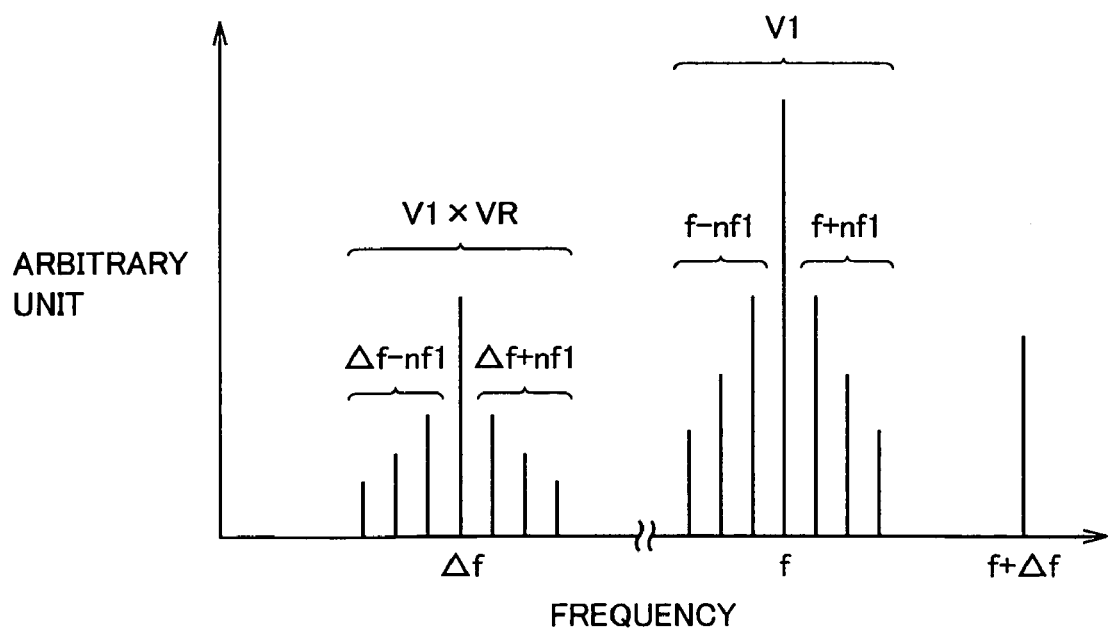
FIG. 5 is a spectral diagram illustrating an operation of the filter circuit shown in FIG. 4.

Here, V1 has a mixed wave formed of the output signals of two high frequency power sources 1, 9 and has a component of frequency f±nf1, as shown in FIG. 5. An output signal V1×VR of mixer 26 has three components of a center frequency f±nf1 and frequencies Δf±nf1, 2f+Δnf1. It is difficult to create a bandpass filter for extracting the component of frequency f from signal V1 having the component of frequency f+nf1, as f/f1 is approximately 1000. However, it is possible to create a bandpass filter for extracting the component of frequency Δf from signal V1×VR having the component of frequency Δf±nf1, as Δf/f1 is approximately 10. Bandpass filter 27 extracts signal component V1' at frequency Δf from signal V1×VR. The level information and phase information of signal V1' includes the level information and phase information of the frequency f component of signal V1.

Output power detector 14 detects level information V (for example an amplitude) of signal V1' and detects progressive wave power Pf at frequency f based on a formula $Pf=K'V^2$ (where K' is a proportionality constant). Output power display portion 15, for example, digitally displays progressive wave power Pf detected by output power detector 14.

Filter circuit 16 also has the same configuration as filter circuit 13. A signal V2' including the level information and phase information of the component of frequency f of signal V2 is applied from filter circuit 16 to reflected power detector 17. Reflected power detector 17 detects level information V of signal V2' and detects reflected wave power Pr at frequency f based on the formula $Pr=K'V^2$. Reflected power display portion 18, for example, digitally displays reflected wave power Pr detected by reflected power detector 17.

Figure 6:
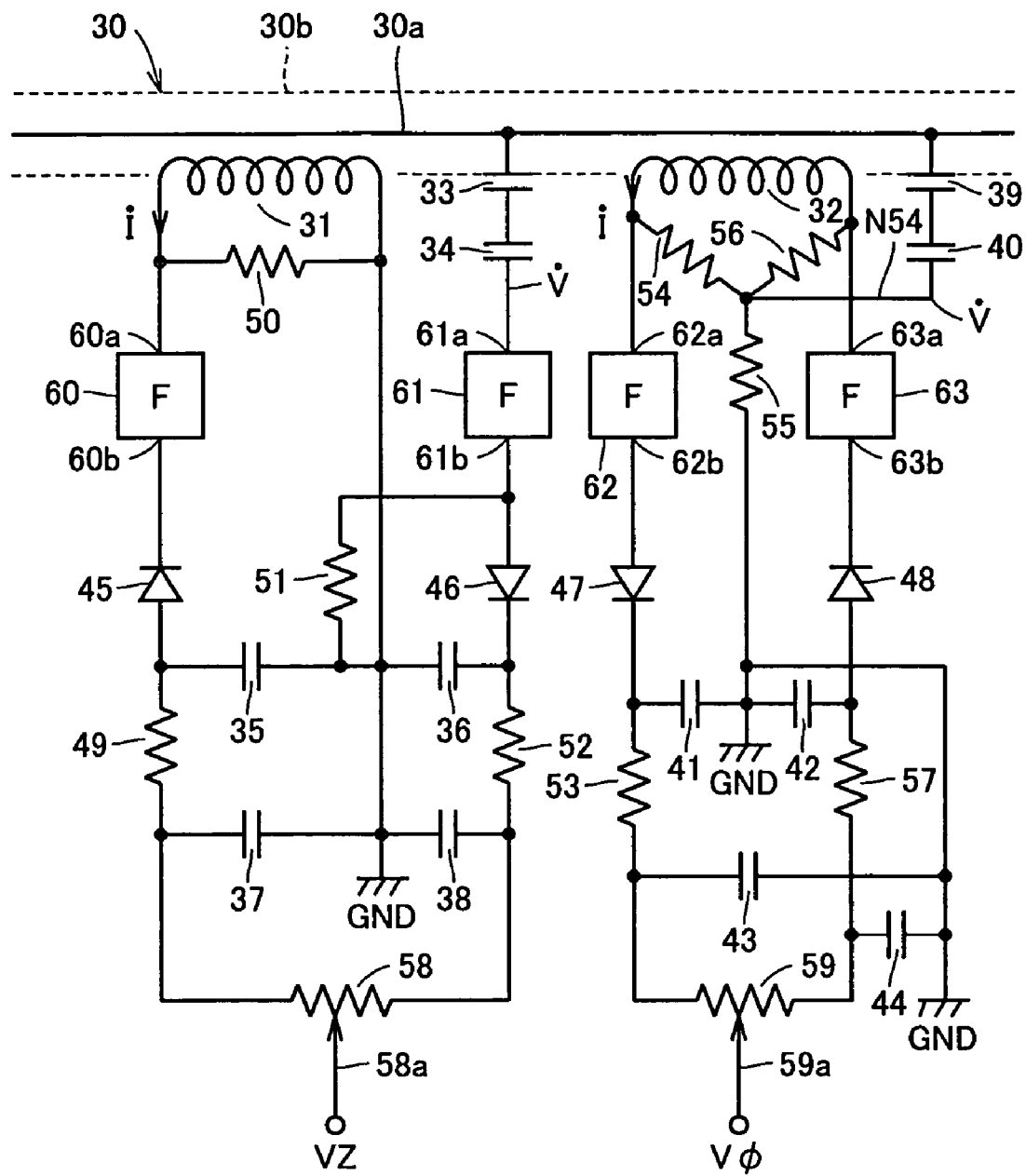
FIG. 6 is a circuit block diagram showing a configuration of a high frequency sensor 2 shown in FIG. 1.

High frequency sensor 2 includes a coaxial line 30, coils 31, 32, capacitors 33–44, diodes 45–48, resistance elements 49–57, variable resistance elements 58, 59, and filter circuits 60–63, as shown in FIG. 6. Each of filter circuits 60–63 has the same configuration as filter circuit 13 shown in FIG. 4. Coaxial line 30 includes an internal conductor 30a and an external conductor 30b and forms a part of the coaxial line between high frequency power source 1 and matching unit 3.

Coil 31 is inductively coupled to internal conductor 30a of coaxial line 30, and a current I having a level and a phase corresponding to the current flowing in internal conductor 30a flows in coil 31. One terminal of coil 31 is connected to an input node 60a of filter circuit 60. Capacitors 33, 34 are connected in series between internal conductor 30a and an input node 61a of filter 61. A voltage V having a level and a phase corresponding to the voltage of internal conductor 30a occurs at node 61a. Diode 46, resistance element 52, variable resistance element 58, resistance element 49, and diode 45 are connected in series between an output node 61*b* of filter circuit 61 and an output node 60*b* of filter circuit 60. A sliding terminal 58*a* of variable resistance element 58 is fixed at a prescribed position. A signal VZ corresponding to a shift with respect to characteristic impedance $Z_0$ (for example 50 Ω) of a ratio Z between voltage V and current I appears at terminal 58*a*. The level of signal VZ is 0 at the time of matching.

Coil 32 is inductively coupled to internal conductor 30*a* of coaxial line 30, and current I having a level and a phase corresponding to the current flowing in internal conductor 30*a* flows in coil 32. Two terminals of coil 32 are connected to input nodes 62*a*, 63*a* of filter circuits 62, 63, respectively. Capacitors 39, 40 are connected in series between internal conductor 30*a* and a node N54. Voltage V having a level and a phase corresponding to the voltage of internal conductor 30*a* occurs at node N54. Node N54 is connected to two terminals of coil 32 through resistance elements 54, 56 and is also grounded through resistance element 55.

Diode 47, resistance element 53, variable resistance element 59, resistance element 57, and diode 48 are connected in series between an output node 62*a* of filter circuit 62 and an output node 63*a* of filter circuit 63. A sliding terminal 59*a* of variable resistance element 59 is fixed at a prescribed position. Resistance elements 54–56 and diodes 47, 48 constitute a balance module. A signal Vφ having a level corresponding to a phase difference φ between voltage V and current I appears at a terminal 59*a*. The level of signal Vφ is 0 at the time of matching. It is noted that capacitors 35–38, 41–44 and resistance elements 49, 52, 53, 57 are provided for noise elimination and potential smoothing.

Figure 7:
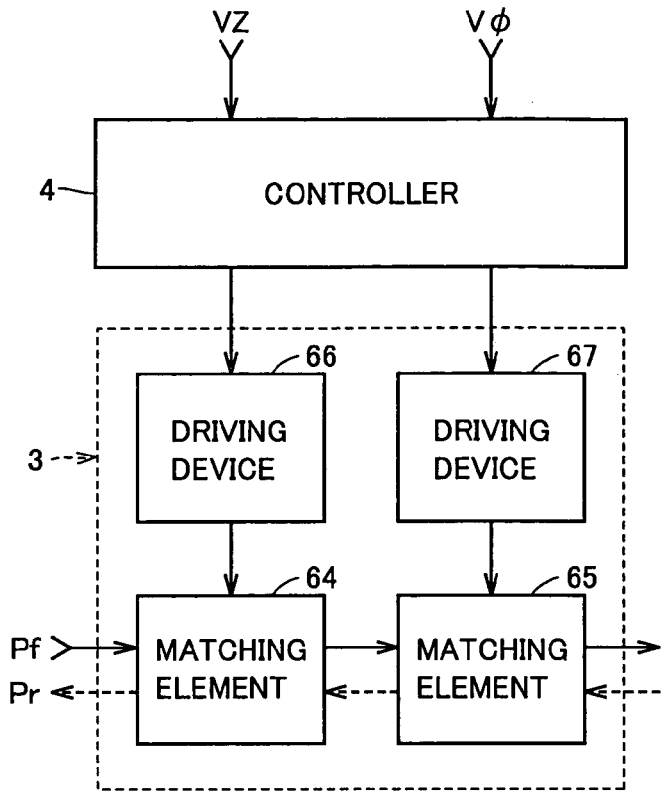
FIG. 7 is a block diagram showing a configuration of a matching unit 3 shown in FIG. 1.

Matching unit 3 includes matching elements 64, 65 and driving devices 66, 67, as shown in FIG. 7. The impedance of each of matching elements 64, 65 is controllable. When the impedance as seen from the input terminal side of matching unit 3 to the reactor 7 side becomes equal to characteristic impedance $Z_0$ of the coaxial line between high frequency power source 1 and matching unit 3, reflected power Pr has the minimum value. Each of driving devices 66, 67 includes a motor, a gear, and the like to drive each of matching units 64, 65.

Controller 4 adjusts the impedance of matching element 64 through driving device 66 such that the level of signal VZ from high frequency sensor 2 attains the minimum value, and it also adjusts the impedance of matching element 65 through driving unit 67 such that the level of signal Vφ from high frequency sensor 2 attains the minimum value.

Returning to FIG. 1, high frequency sensor 5 detects voltage V and current I on the interconnection between matching unit 3 and reaction chamber 7. High frequency sensor 5 includes, for example, coil 31, capacitors 33, 34, resistance element 50, and filter circuits 60, 61 of high frequency sensor 2 shown in FIG. 6. Output nodes 60*b*, 61*b* of filter circuits 60, 61 are connected to monitoring device 6. Monitoring device 6 is formed, for example, of an oscilloscope. Monitoring device 6 is capable of monitoring a voltage, a current, and impedance between the electrodes of reaction chamber 7 and detecting the state of plasma between the electrodes.

High frequency power source 9 is a bias power source device for supplying the high frequency power at frequency f1 to reaction chamber 7. Matching unit 8 is provided in order to limit the reflected wave power to high frequency power source 9 to the minimum value. Matching unit 8 includes a coil and a capacitor and performs a function of preventing the high frequency power from high frequency power source 1 from being input to high frequency power source 9.

Figure 8:
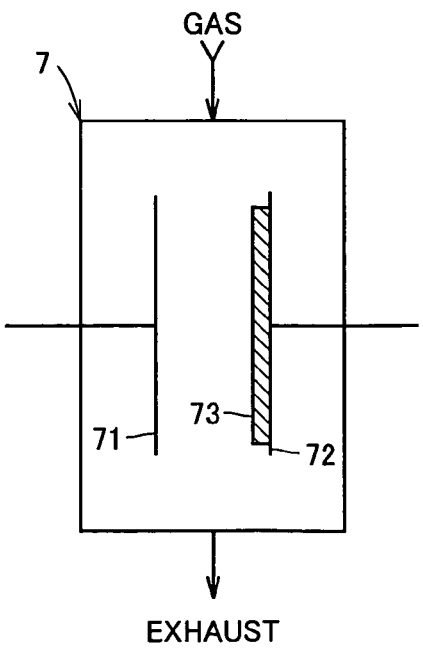
FIG. 8 is a diagram showing a configuration of a reaction chamber shown in FIG. 1.

As shown in FIG. 8, for example, two parallel flat plate electrodes 71, 72 are provided within reaction chamber 7. The high frequency powers from high frequency power sources 1, 9 are supplied to electrodes 71, 72, respectively. A substrate 73 is set on the surface of electrode 72.

In etching and film deposition, the air in reaction chamber 7 is first exhausted by a vacuum pump (not shown). Then, a prescribed gas is introduced into reaction chamber 7 at a prescribed flow rate, and an exhausting rate of the vacuum pump is adjusted so that the pressure in reaction chamber 7 is adjusted at a prescribed value.

Then, high frequency power sources 1, 9 are turned on to supply prescribed high frequency powers to reaction chamber 7. As a result, the gas between electrodes 71 and 72 is ionized in a plasma state. The power for bringing the gas into the plasma state is mainly supplied from high frequency power source 1, while the power for applying the gas ions to substrate 73 is mainly supplied from high frequency power source 9. When etching gas (for example $CF_4$) is used, the surface of substrate 73 is etched. When film depositing gas (for example $SiH_4$) is used, a film is deposited on the surface of substrate 73.

In the present embodiment, a mixed signal of a high frequency signal having frequency f and a high frequency signal having frequency f1 is converted into a high frequency signal having frequency $\Delta f(f>\Delta f>f1)$ using the heterodyne system, and based on this high frequency signal, the high frequency voltage, the current, the ratio therebetween, the phase difference therebetween, the power, and the like of frequency f are detected. It is therefore possible to easily and accurately detect the high frequency voltage and the like of frequency f and to accurately control the high frequency power.

It is noted that although in the present embodiment, local oscillator 25 generates high frequency signal VR having frequency f+Δf, which is a sum of frequency f of high frequency power source 1 and a prescribed frequency Δf, for application to mixer 26, it is needless to say that the same result is obtained when local oscillator 25 generates a high frequency signal VR having a frequency f−Δf, which is a difference between f and Δf. Note that in this case, output signal V1×VR of mixer 26 has three components: center frequency f±nf1 and frequencies Δf±nf1, 2f−Δf±nf1.

It should be understood that the embodiment disclosed herein is taken by way of illustration not by way of limitation in all the respects. The scope of the present invention is shown not in the forgoing description but in the claims, and it is intended that all equivalents to the claims and all modifications within the claims should be embraced.

What is claimed is:

1. A high frequency detection method for detecting information about a first high frequency power in a plasma generator, for generating plasma, by supplying said first high frequency power having a first frequency to a reaction chamber via a first power supply line and supplying a second high frequency power having a second frequency lower than said first frequency to said reaction chamber via a second power supply line, said first high frequency power being modulated by said second high frequency power to generate a third high frequency power having a third frequency in said reaction chamber, said high frequency detection method comprising:

a first step of detecting a first high frequency signal having components of said first and third frequencies propagating through said first power supply line;

a second step of generating a second high frequency signal having a frequency which is a sum of said first frequency and a predetermined fourth frequency between said first and second frequencies, or said second high frequency having a frequency which is a difference between said first frequency and the predetermined fourth frequency which is between said first and second frequencies;

a third step of generating a third high frequency signal by mixing said first and second high frequency signals;

a fourth step of extracting a fourth high frequency signal having said fourth frequency from said third high frequency signal; and a fifth step of obtaining the information about said first high frequency power based on said fourth high frequency signal.

2. A high frequency detection circuit for detecting information about a first high frequency power in a plasma generator, for generating plasma, by supplying said first high frequency power having a first frequency to a reaction chamber via a first power supply line and supplying a second high frequency power having a second frequency lower than said first frequency to said reaction chamber via a second power supply line, said first high frequency power being modulated by said second high frequency power to generate a third high frequency power having a third frequency in said reaction chamber, said high frequency detection circuit comprising:

a signal detection circuit detecting a first high frequency signal having components of said first and third frequencies propagating through said first power supply line;

a local oscillator generating a second high frequency signal having a frequency which is a sum of said first frequency and a predetermined fourth frequency which is between said first and second frequencies, or said second high frequency signal being a difference between said first frequency and the predetermined fourth frequency which is between said first and second frequencies;

a mixer circuit generating a third high frequency signal by mixing said first and second high frequency signals;

a filter circuit extracting a fourth high frequency signal having said fourth frequency from said third high frequency signal; and a detector obtaining the information about said first high frequency power based on said fourth high frequency signal.

3. A high frequency detection circuit for detecting a high frequency power in a plasma generator, for generating plasma, by supplying a first high frequency power having a first frequency to a reaction chamber via a first power supply line and supplying a second high frequency power having a second frequency lower than said first frequency to said reaction chamber via a second power supply line, said first high frequency power being modulated by said second high frequency power to generate a third high frequency power having a third frequency in said reaction chamber, said high frequency detection circuit comprising:

a directional coupler coupled to a portion of said first power supply line and detecting a first high frequency signal indicative of a progressive wave power progressing to said reaction chamber and having components of said first and third frequencies, and a second high frequency signal indicative of a reflected wave power reflected from said reaction chamber and having the components of said first and third frequencies;

a local oscillator generating a third high frequency signal having a frequency which is a sum of said first frequency and a predetermined fourth frequency between said first and second frequencies, or a difference between said first frequency and the predetermined fourth frequency between said first and second frequencies;

a first mixer circuit generating a fourth high frequency signal by mixing said first and third high frequency signals;

a second mixer circuit generating a fifth high frequency signal by mixing said second and third high frequency signals;

a first filter circuit extracting a sixth high frequency signal having said fourth frequency from said fourth mixed signal;

a second filter circuit extracting a seventh high frequency signal having said fourth frequency from said fifth mixed signal;

a first power detector obtaining the component of said first frequency in the progressive wave power progressing to said reaction chamber based on said sixth high frequency signal; and a second power detector obtaining the component of said first frequency in the reflected wave power reflected from said reaction chamber based on said seventh high frequency signal.

4. A high frequency detection circuit for detecting a matching state in a plasma generator, for generating plasma, by supplying a first high frequency power having a first frequency to a reaction chamber via a first power supply line and a first matching unit and supplying a second high frequency power having a second frequency lower than said first frequency to said reaction chamber via a second power supply line and a second matching unit, said first high frequency power being modulated by said second high frequency power to generate a third high frequency power having a third frequency in said reaction chamber, said high frequency detection circuit comprising:

a signal detection circuit coupled to a portion of said first power supply line and detecting a first high frequency signal indicative of a current flowing through said first power supply line and having components of said first and third frequencies, and a second high frequency signal indicative of a voltage of said first power supply line and having the components of said first and third frequencies;

a local oscillator generating a third high frequency signal having a frequency which is a sum of said first frequency and a predetermined fourth frequency between said first and second frequencies, or a difference between said first frequency and the predetermined fourth frequency between said first and second frequencies;

a first mixer circuit generating a fourth high frequency signal by mixing said first and third high frequency signals;

a second mixer circuit generating a fifth high frequency signal by mixing said second and third high frequency signals;

a first filter circuit extracting a sixth high frequency signal having said fourth frequency from said fourth mixed signal;

a second filter circuit extracting a seventh high frequency signal having said fourth frequency from said fifth mixed signal; and a signal generating circuit outputting a signal indicative of a matching state of said first power supply line and said reaction chamber based on said sixth and seventh high frequency signals.

5. A high frequency detection circuit for detecting a high frequency current in a plasma generator, for generating plasma, by supplying a first high frequency power having a first frequency to a reaction chamber via a first power supply line and supplying a second high frequency power having a second frequency lower than said first frequency to said reaction chamber via a second power supply line, said first high frequency power being modulated by said second high frequency power to generate a third high frequency power having a third frequency in said reaction chamber, said high frequency detection circuit comprising:

a signal detection circuit coupled to a portion of said first power supply line and detecting a first high frequency signal indicative of a current flowing through said first power supply line and having components of said first and third frequencies;

a local oscillator generating a second high frequency signal having a frequency which is a sum of said first frequency and a predetermined fourth frequency between said first and second frequencies, or a different between said first frequency and the predetermined fourth frequency between said first and second frequencies;

a mixer circuit generating a third high frequency signal by mixing said first and second high frequency signals; and a filter circuit extracting a fourth high frequency signal having said fourth frequency and indicative of the component of said first frequency in the current flowing through said first power supply line from said third high frequency signal.

6. A high frequency detection circuit for detecting a high frequency voltage in a plasma generator for generating plasma by supplying a first high frequency power having a first frequency to a reaction chamber via a first power supply line and supplying a second high frequency power having a second frequency lower than said first frequency to said reaction chamber via a second power supply line, said first high frequency power being modulated by said second high frequency power to generate a third high frequency power having a third frequency in said reaction chamber, said high frequency detection circuit comprising:

a signal detection circuit coupled to a portion of said first power supply line and detecting a first high frequency signal indicative of a voltage of said first power supply line and having components of said first and third frequencies;

a local oscillator generating a second high frequency signal having a frequency which is a sum of said first frequency and a predetermined fourth frequency between said first and second frequencies, or a difference between said first frequency and the predetermined fourth frequency between said first and second frequencies;

a mixer circuit generating a third high frequency signal by mixing said first and second high frequency signals; and a filter circuit extracting a fourth high frequency signal having said fourth frequency and indicative of the component of said first frequency in the voltage of said first power supply line.

* * * * *